(12) United States Patent
Yamazaki et al.

(10) Patent No.: US 9,099,579 B2
(45) Date of Patent: Aug. 4, 2015

(54) PHOTOELECTRIC CONVERSION DEVICE AND MANUFACTURING METHOD THEREOF

(71) Applicant: Semiconductor Energy Laboratory Co., Ltd., Kanagawa-ken (JP)

(72) Inventors: Shunpei Yamazaki, Tokyo (JP); Yasuyuki Arai, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 14/331,664

(22) Filed: Jul. 15, 2014

(65) Prior Publication Data

US 2014/0326307 A1    Nov. 6, 2014

Related U.S. Application Data

(62) Division of application No. 13/161,947, filed on Jun. 16, 2011, now Pat. No. 8,816,194.

(30) Foreign Application Priority Data

Jun. 18, 2010   (JP) ................................ 2010-139799

(51) Int. Cl.
*H01L 31/0224*   (2006.01)
*H01L 31/0216*   (2014.01)
(Continued)

(52) U.S. Cl.
CPC .. *H01L 31/022441* (2013.01); *H01L 31/02168* (2013.01); *H01L 31/02363* (2013.01); *H01L 31/0682* (2013.01); *Y02E 10/547* (2013.01)

(58) Field of Classification Search
CPC ................... H01L 31/02168; H01L 31/02363; H01L 31/0682; H01L 31/022441

USPC ....................... 136/256, 255, 252; 438/71, 72
See application file for complete search history.

(56) References Cited

U.S. PATENT DOCUMENTS 4,099,986 A   7/1978   Diepers
4,155,781 A   5/1979   Diepers
(Continued)

FOREIGN PATENT DOCUMENTS

CN   001147156 A   4/1997
EP   1 947 701 A2   7/2008
(Continued)

OTHER PUBLICATIONS

Gangloff, L. et al., "Self-Aligned, Gated Arrays of Individual Nanotube and Nanowire Emitters," Nano Letters, Sep. 1, 2004, vol. 4, No. 9, pp. 1575-1579.

(Continued)

*Primary Examiner* — Golam Mowla
(74) *Attorney, Agent, or Firm* — Husch Blackwell LLP

(57) ABSTRACT

A photoelectric conversion device with a novel anti-reflection structure. In the photoelectric conversion device, a front surface of a semiconductor substrate which serves as a light-receiving surface is covered with a group of whiskers (a group of nanowires) so that surface reflection is reduced. In other words, a semiconductor layer which has a front surface where crystals grow so that whiskers are formed is provided on the light-receiving surface side of the semiconductor substrate. The semiconductor layer has a given uneven structure, and thus has effects of reducing reflection on the front surface of the semiconductor substrate and increasing conversion efficiency.

16 Claims, 7 Drawing Sheets

(51) Int. Cl.
*H01L 31/0236* (2006.01)
*H01L 31/068* (2012.01)

(56) References Cited

U.S. PATENT DOCUMENTS

| | | | |
|---|---|---|---|
| 4,200,472 A | 4/1980 | Chappell et al. | |
| 4,315,097 A | 2/1982 | Solomon | |
| 4,838,952 A | 6/1989 | Dill et al. | |
| 4,927,770 A | 5/1990 | Swanson | |
| 5,053,083 A | 10/1991 | Sinton | |
| 5,067,985 A | 11/1991 | Carver et al. | |
| 5,538,564 A | 7/1996 | Kaschmitter | |
| 5,641,362 A | 6/1997 | Meier | |
| 5,973,260 A | 10/1999 | Tange et al. | |
| 6,387,726 B1 | 5/2002 | Verlinden et al. | |
| 6,423,568 B1 | 7/2002 | Verlinden et al. | |
| 6,518,494 B1 | 2/2003 | Shibuya et al. | |
| 6,998,288 B1 | 2/2006 | Smith et al. | |
| 7,199,395 B2 | 4/2007 | Terakawa et al. | |
| 7,339,110 B1 | 3/2008 | Mulligan et al. | |
| 7,396,409 B2 | 7/2008 | Hatta et al. | |
| 7,468,485 B1 | 12/2008 | Swanson | |
| 7,633,006 B1 | 12/2009 | Swanson | |
| 7,718,888 B2 | 5/2010 | Cousins | |
| 7,935,966 B2 | 5/2011 | Ribeyron et al. | |
| 7,959,831 B2 | 6/2011 | Akimoto | |
| 7,998,539 B2 | 8/2011 | Chang et al. | |
| 8,049,333 B2 | 11/2011 | Alden et al. | |
| 8,242,354 B2 | 8/2012 | Smith | |
| 8,865,027 B2 | 10/2014 | Alden et al. | |
| 2002/0011590 A1 | 1/2002 | Nagashima | |
| 2003/0106581 A1 | 6/2003 | Shibuya et al. | |
| 2004/0200520 A1 | 10/2004 | Mulligan et al. | |
| 2005/0126627 A1 | 6/2005 | Hayashida | |
| 2006/0130891 A1 | 6/2006 | Carlson | |
| 2007/0151599 A1 | 7/2007 | Cousins | |
| 2008/0006319 A1 | 1/2008 | Bettge et al. | |
| 2008/0072953 A1 | 3/2008 | Stephens et al. | |
| 2008/0230119 A1 | 9/2008 | Akimoto | |
| 2008/0286447 A1 | 11/2008 | Alden et al. | |
| 2009/0223562 A1 | 9/2009 | Niira et al. | |
| 2010/0154876 A1 | 6/2010 | Camalleri et al. | |
| 2010/0170562 A1 | 7/2010 | Akimoto | |
| 2010/0236613 A1 | 9/2010 | Lee et al. | |
| 2010/0243040 A1 | 9/2010 | Kim | |
| 2010/0261001 A1 | 10/2010 | Chang et al. | |
| 2011/0023956 A1 | 2/2011 | Harder | |
| 2011/0041911 A1 | 2/2011 | Lee et al. | |
| 2011/0056551 A1 | 3/2011 | Kim et al. | |
| 2011/0065229 A1 | 3/2011 | Jeong et al. | |
| 2011/0100457 A1 | 5/2011 | Kim et al. | |
| 2011/0120530 A1 | 5/2011 | Isaka | |
| 2011/0197963 A1 | 8/2011 | Akimoto | |
| 2011/0201146 A1 | 8/2011 | Akimoto | |
| 2011/0259423 A1 | 10/2011 | Korevaar et al. | |
| 2011/0308591 A1 | 12/2011 | Yamazaki et al. | |
| 2012/0145233 A1 | 6/2012 | Syn et al. | |
| 2012/0211063 A1 | 8/2012 | Lee et al. | |
| 2013/0068286 A1 | 3/2013 | Wang et al. | |

FOREIGN PATENT DOCUMENTS

| | | |
|---|---|---|
| EP | 1 947 702 A2 | 7/2008 |
| EP | 1 962 348 A2 | 8/2008 |
| EP | 1 962 349 A2 | 8/2008 |
| EP | 1 965 438 A2 | 9/2008 |
| EP | 2 251 389 A1 | 11/2010 |
| EP | 2 363 891 A2 | 9/2011 |
| EP | 2 477 230 A2 | 7/2012 |
| JP | 53-031987 A | 3/1978 |
| JP | 2002-164556 A | 6/2002 |
| JP | 2003-258285 A | 9/2003 |
| JP | 2006-080450 A | 3/2006 |
| JP | 2006-133617 A | 5/2006 |
| TW | 200729241 | 8/2007 |
| TW | 201007818 | 2/2010 |
| WO | WO 2007/022226 A2 | 2/2007 |

OTHER PUBLICATIONS

Leu, I.-C. et al., "Chemical Vapor Deposition of Silicon Carbide Whiskers Activated by Elemental Nickel," Journal of the Electrochemical Society, 1999, vol. 146, No. 1, pp. 184-188.

Pedraza, A.J. et al., "Silicon Microcolumn Arrays Grown by Nanosecond Pulsed-Excimer Laser Irridiation," Applied Physics Letters, Apr. 19, 1999, vol. 74, No. 16, pp. 2322-2324.

Felter, T.E. et al., "Cathodoluminescent Field Emission Flat Panel Display Prototype Built Using Arrays of Diamond-Coated Silicon Tips," SID Digest '98: SID International Symposium Digest of Technical Papers, May 1, 1998, vol. 29, pp. 577-581.

Gangloff, L. et al., "Self-Aligned, Gated Arrays of Individual Nanotube and Nanowire Emitters," Nano Letters, Jul. 29, 2004, vol. 4, No. 9, pp. 1575-1579.

Taiwanese Office Action re Application No. TW 100120886, dated May 20, 2015.

PHOTOELECTRIC CONVERSION DEVICE AND MANUFACTURING METHOD THEREOF

This application is a divisional of U.S. application Ser. No. 13/161,947, filed on Jun. 16, 2011 which is incorporated herein by reference.

BACKGROUND OF THE INVENTION

1. Field of the Invention

The present invention relates to a photoelectric conversion device. One embodiment of the disclosed invention includes a back contact element structure.

2. Description of the Related Art

A solar cell in which a single crystal silicon substrate or a polycrystalline silicon substrate is used for a photoelectric conversion layer has been developed as one of photoelectric conversion devices. In such a solar cell, an uneven structure is formed on a front surface of the silicon substrate in order to reduce surface reflection. This uneven structure is formed by etching the silicon substrate with an alkaline solution such as NaOH. An alkaline solution has different etching rates depending on crystal plane orientations of silicon. Thus, for example, when a silicon substrate which has a crystal plane orientation of (100) is etched, a pyramidal uneven structure is formed. Back contact solar cells which have such an uneven structure have been proposed (e.g., Patent Document 1 and Patent Document 2).

However, etching with an alkaline solution contaminates a silicon substrate, and thus is not suitable. In addition, etching characteristics greatly vary depending on the concentration or temperature of an alkaline solution, which makes it difficult to form an uneven structure with high reproducibility. In view of the above, a method in which etching with an alkaline solution and a laser processing technique are combined has been proposed (e.g., Patent Document 3).

However, even by the method disclosed in Patent Document 3, it is difficult to form an uneven structure by etching, for example, in the case where a thin film is used as a photoelectric conversion layer.

[Reference]

[Patent Document 1] Japanese Published Patent Application No. 2002-164556

[Patent Document 2] Japanese Published Patent Application No. 2006-080450

[Patent Document 3] Japanese Published Patent Application No. 2003-258285

SUMMARY OF THE INVENTION

Etching a photoelectric conversion layer itself in order to form the above uneven structure is not preferable for the following reasons: a problem with controllability for the uneven structure is caused and the characteristics of a solar cell are adversely affected. Moreover, an alkaline solution and a large amount of rinse water is needed for the etching; thus, attention needs to be paid to contamination. For that reason, such etching is not preferable also in terms of productivity.

In view of the above, an object of one embodiment of the present invention is to provide a photoelectric conversion device with a novel anti-reflection structure.

A semiconductor surface which serves as a light-receiving surface is covered with a group of whiskers (also referred to as nanowires) so that surface reflection is reduced. In other words, a semiconductor layer with a front surface where crystals grow so that whiskers are formed is provided on the light-receiving surface side of a semiconductor substrate. The semiconductor layer has a given uneven structure, and thus has an effect of reducing reflection on the front surface of the semiconductor substrate.

One embodiment of the present invention is a photoelectric conversion device. The photoelectric conversion device includes a semiconductor substrate; a group of whiskers which is formed of a crystalline semiconductor and is provided on a front surface of the semiconductor substrate; an $n^+$ region and a $p^+$ region which are provided on the back surface side of the semiconductor substrate; a first electrode which is electrically connected to the $n^+$ region; and a second electrode which is electrically connected to the $p^+$ region.

Another embodiment of the present invention is a photoelectric conversion device. The photoelectric conversion device includes a semiconductor substrate; a group of whiskers which is formed of a crystalline semiconductor and is provided on a front surface of the semiconductor substrate; an $n^+$ region and a $p^+$ region which are provided on the back surface side of the semiconductor substrate; a first electrode which is electrically connected to the $n^+$ region; a second electrode which is electrically connected to the $p^+$ region; and an insulating film which is provided on the group of whiskers.

Note that whiskers are formed in such a manner that crystals of a semiconductor material grow so as to have column-like protrusions or needle-like protrusions on the front surface of the semiconductor substrate.

Further, the $n^+$ region is an n-type impurity region (also referred to as an n-type region) in which impurity elements imparting n-type conductivity are contained at high concentration; the $p^+$ region is a p-type impurity region (also referred to as a p-type region) in which impurity elements imparting p-type conductivity are contained at high concentration. Note that the term "high concentration" means the case where the carrier density of each region is higher than the carrier density of the semiconductor substrate.

The semiconductor layer which is grown so as to have whiskers as described above functions as an anti-reflection layer. Thus, light loss due to reflection on a light-receiving surface can be reduced and conversion efficiency can be increased.

Further, when an uneven structure on a light-receiving surface is formed with the use of a special semiconductor coating film which is grown by vapor deposition without etching with an alkaline solution unlike a conventional method, contamination of a semiconductor substrate can be prevented and productivity can be increased.

DETAILED DESCRIPTION OF THE INVENTION

Figure 1A:
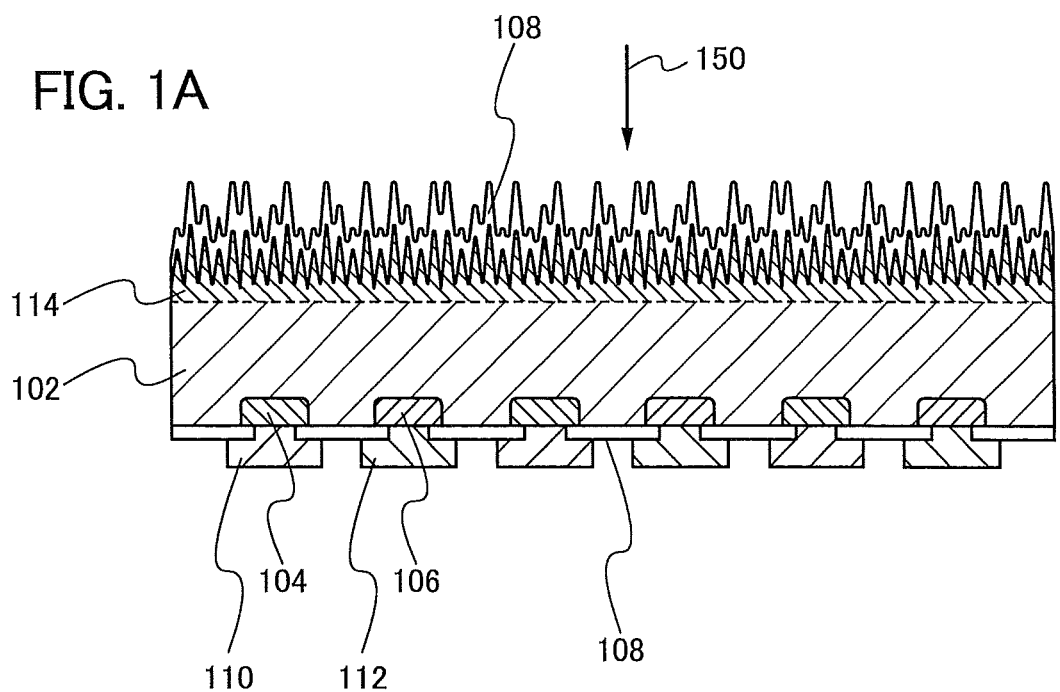
FIGS. 1A to 1C illustrate structures of a photoelectric conversion device.

Embodiments of the present invention disclosed will be described below with reference to the drawings. However, the present invention is not limited to the following description, and it is easily understood by those skilled in the art that the modes and details of the present invention can be changed in various ways without departing from the spirit and scope of the present invention. Therefore, the present invention disclosed should not be construed as being limited to the description in Embodiments below.

In Embodiments hereinafter described, the same parts are denoted with the same reference numerals throughout the drawings. Note that the thickness, the width, a relative position, and the like of components, that is, layers, regions, and the like illustrated in the drawings are exaggerated in some cases for clarification in the description of the embodiments.
(Embodiment 1)

In this embodiment, structural examples of a photoelectric conversion device will be described.

Figure 1B:
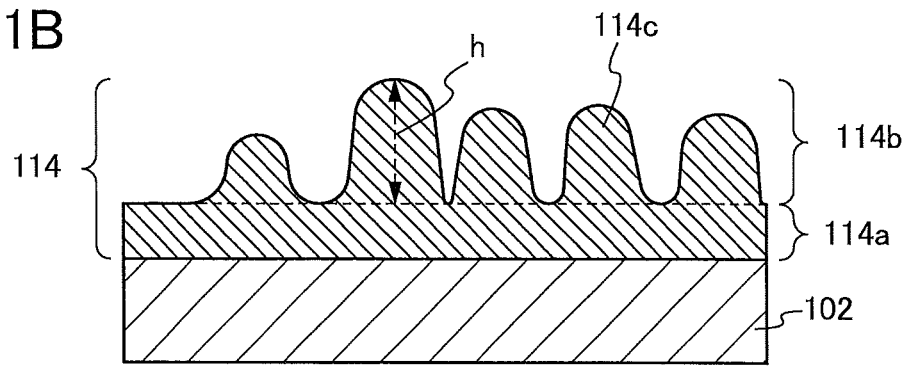
Figure 1C:
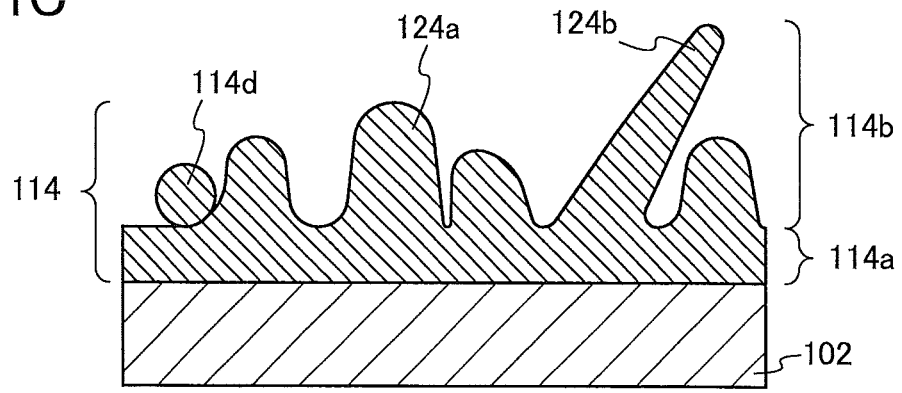

FIGS. 1A to 1C illustrate structural examples of a photoelectric conversion device.

The photoelectric conversion device includes a semiconductor substrate 102 and receives light from the front surface (also referred to as light-receiving surface) side of the semiconductor substrate 102. In one embodiment of the present invention, the photoelectric conversion device has an uneven structure for reducing reflection of incident light 150 on a front surface of the semiconductor substrate 102. The structure will be specifically described below.

A group of whiskers 114 is formed on the front surface of the semiconductor substrate 102 as the uneven structure. The group of whiskers 114 can reduce surface reflection of the incident light 150 on the light-receiving surface. The group of whiskers 114 will be specifically described below.

FIG. 1B is an enlarged view of the group of whiskers 114.

As illustrated in FIG. 1B, the group of whiskers 114 includes a crystalline semiconductor region 114a which covers the semiconductor substrate 102 and a whisker-like crystalline semiconductor region 114b which is formed over the crystalline semiconductor region 114a. The whiskers are formed in such a manner that crystals of a semiconductor material (e.g., silicon) grow so as to have column-like or needle-like protrusions 114c. The group of whiskers 114 has a plurality of the column-like or needle-like protrusions 114c.

Here, an interface between the crystalline semiconductor region 114a and the crystalline semiconductor region 114b is not clear. Therefore, the plane that is at the same level as the bottom of the deepest valley of the valleys formed among the protrusions 114c and is parallel to the front surface of the semiconductor substrate 102 is regarded as the interface between the crystalline semiconductor region 114a and the crystalline semiconductor region 114b.

Examples of the specific shape of the protrusion 114c include a column-like shape such as a cylindrical shape or a prismatic shape, a needle-like shape such as a conical shape or a polygonal pyramid shape, and the like. The top of the protrusion 114c may be rounded. The diameter of the protrusion 114c is greater than or equal to 50 nm and less than or equal to 10 μm, preferably greater than or equal to 500 nm and less than or equal to 3 μm. The length h along the axis of the protrusion 114c is greater than or equal to 0.5 μm and less than or equal to 1000 μm, preferably greater than or equal to 1.0 μm and less than or equal to 100 μm.

Note that the length h along the axis of the protrusion 114c is the distance between the top (or the center of the top surface) of the protrusion 114c and the crystalline semiconductor region 114a along the axis running through the top (or the center of the top surface) of the protrusion 114c.

Further, the thickness of the group of whiskers 114 is the sum of the thickness of the crystalline semiconductor region 114a and the thickness of the crystalline semiconductor region 114b. Here, the thickness of the crystalline semiconductor region 114b is the length of the line which perpendicularly runs from the top of the protrusion 114c to the crystalline semiconductor region 114a (i.e., the height of the protrusion 114c).

Further, the diameter of the protrusion 114c is the length of a long axis in a transverse cross-sectional shape of the protrusion 114c at the interface between the crystalline semiconductor region 114a and the crystalline semiconductor region 114b.

Note that the direction in which the protrusion 114c extends from the crystalline semiconductor region 114a is referred to as a longitudinal direction and the cross-sectional shape along the longitudinal direction is referred to as a longitudinal cross-sectional shape. In addition, the shape of the plane normal to the longitudinal direction is referred to as a transverse cross-sectional shape.

In FIG. 1B, the longitudinal directions of the protrusions 114c extend in one direction, for example, in the direction normal to the front surface of the crystalline semiconductor region 114a. Note that the longitudinal direction of the protrusion 114c may be substantially the same as the direction normal to the front surface of the crystalline semiconductor region 114a. In that case, it is preferable that the difference in angle between the two directions be typically within 5°. The longitudinal direction of the protrusion 114c is substantially the same as the direction normal to the front surface of the crystalline semiconductor region 114a as described above; therefore, FIG. 1B illustrates only the longitudinal cross-sectional shape of the protrusions 114c.

As another example, the longitudinal directions of a plurality of protrusions may vary as illustrated in FIG. 1C. Typically, the crystalline semiconductor region 114b may include a first protrusion 124a whose longitudinal direction is substantially the same as the normal direction and a second protrusion 124b whose longitudinal direction is different from the normal direction. Moreover, the length along the axis of the second protrusion 124b may be greater than the length along the axis of the first protrusion 124a. The longitudinal directions of the plurality of protrusions vary as described above; therefore, the longitudinal cross-sectional shapes of the protrusions and the transverse cross-sectional shape of the protrusion (i.e., a region 114d) coexist in FIG. 1C.

Figure 6:
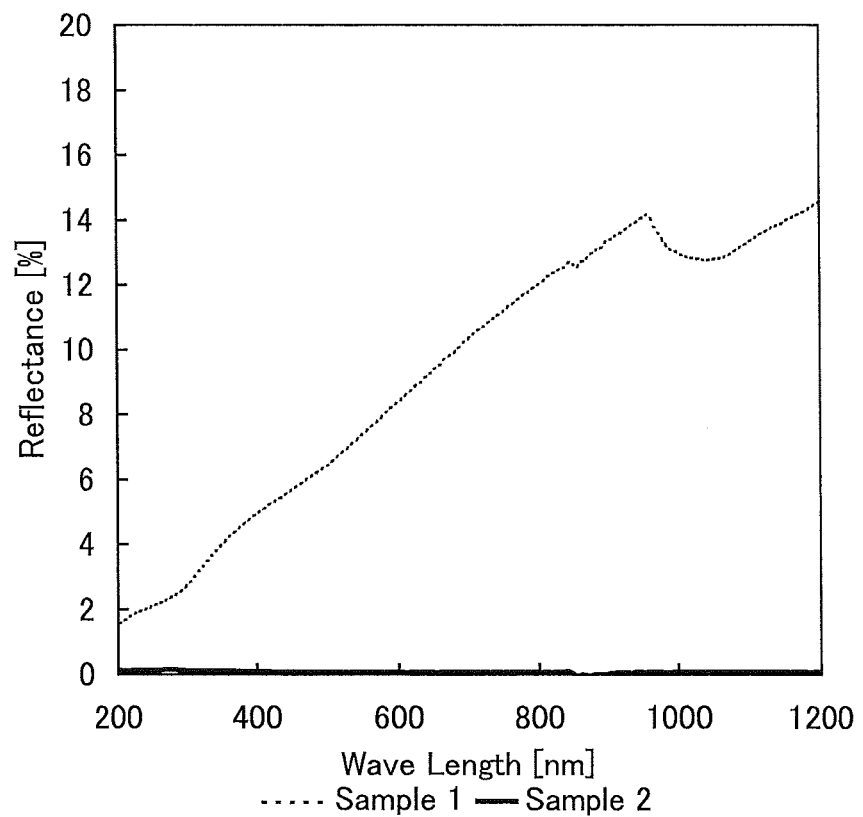
FIG. 6 shows reflectance of whiskers.

Optical characteristics of such a group of whiskers will be described with reference to FIG. 6. FIG. 6 is a graph showing the wavelength dependence of regular reflectance of a titanium foil and a sample including a group of silicon whiskers having a polycrystalline structure on the titanium foil.

A sample 1 whose reflectance is represented by a dotted line in FIG. 6 is a titanium foil which is cut in a circle with a diameter φ of 12 mm and has a thickness of 0.1 mm. In addition, a sample 2 whose reflectance is represented by a solid line is formed in such a manner that a polysilicon layer including a group of whiskers is formed over the titanium foil with a diameter φ of 12 mm and a thickness of 0.1 mm, which are similar to those of the sample 1, by an LPCVD method. The polysilicon layer here is formed by introducing silane for deposition for 2 hours and 15 minutes at a flow rate of 300 sccm into a process chamber in which the pressure is set to 13 Pa and the substrate temperature is set to 600° C.

The regular reflectance was measured by a spectrophotometer (U-4100 Spectrophotometer, manufactured by. Hitachi High-Technologies Corporation). Here, the samples 1 and 2 were irradiated with light having wavelengths from 200 nm to 1200 nm with a sampling interval of 2 nm. In addition, the reflectance was measured under the condition that the angle of incident light on each sample was 5° (i.e., 5-degree regular reflectance was measured). The horizontal axis represents the wavelength of the irradiation light and the vertical axis represents the reflectance of the irradiation light.

According to FIG. 6, the sample 2 in which the polysilicon layer including the group of whiskers is formed on the surface of the titanium foil has an extremely low reflectance as can be seen from its regular reflectance of 0% to 0.15%, which means that there is almost no light reflection. Note that since the SN ratio is small in the wavelength range of 850 nm to 894 nm, the reflectance is negative. In contrast, the sample 1 that is the titanium foil has a regular reflectance of 2% to 15%. The results show that the reflectance can be reduced by forming the polysilicon layer including the group of whiskers on the surface of the titanium foil.

As is clear from the characteristics shown in FIG. 6, when the group of whiskers 114 is provided, the surface reflectance of visible light in the entire wavelength range can be reduced to be less than or equal to 10%, preferably less than or equal to 5%.

An $n^+$ region 104 and a $p^+$ region 106 are formed on the back surface side of the semiconductor substrate 102. In addition, an electrode 110 and an electrode 112 are formed on the $n^+$ region 104 and the $p^+$ region 106, respectively. Note that a p-type substrate is used as the semiconductor substrate 102.

In other words, a photoelectric conversion element including the electrode 110, the $n^+$ region 104, the p-type semiconductor substrate 102, the $p^+$ region 106, and the electrode 112 is formed on the back surface side of the semiconductor substrate 102. The photoelectric conversion device has one or more of the photoelectric conversion elements. Here, the p-type semiconductor substrate 102 (also referred to as a p region) serves as an active layer.

Thus, according to one embodiment of the photoelectric conversion device, electrical contacts are made on the back surface (the surface opposite to the light-receiving surface). The photoelectric conversion device has a so-called back contact structure. Note that without limitation to the back contact structure, the photoelectric conversion device may have a group of whiskers on the light-receiving surface, as described above.

Note that an insulating film 108 may be formed on a back surface of the semiconductor substrate 102. In that case, through contact holes formed in the insulating film 108, the $n^+$ region 104 and the electrode 110 are electrically connected to each other, and the $p^+$ region 106 and the electrode 112 are electrically connected to each other.

Silicon or germanium is typically used for the semiconductor substrate 102. Alternatively, a compound semiconductor such as gallium arsenide or indium phosphide may be used. Note that a single crystal semiconductor substrate or a polycrystalline semiconductor substrate can be used as the semiconductor substrate 102. For example, the p-type semiconductor substrate contains an impurity element imparting p-type conductivity, such as boron. Note that an n-type semiconductor substrate may be used; for example, a substrate which contains an impurity element imparting n-type conductivity, such as phosphorus, is used. In addition, a substrate in a plate form or a thin film form can be used as the semiconductor substrate 102.

Figure 7A:
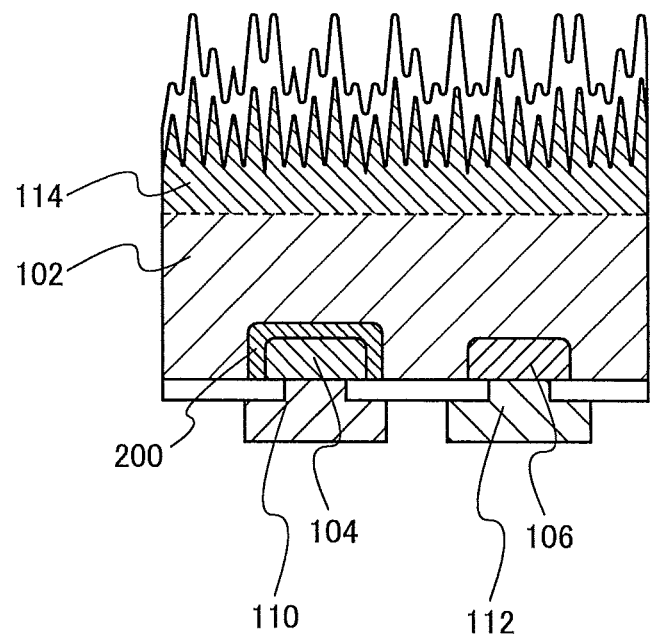
FIGS. 7A and 7B illustrate structures of the photoelectric conversion device.

Further, a $p^-$ region 200 may be provided between the p-type semiconductor substrate 102 (p region) and the $n^+$ region 104 so that an $n^+/p^-/p/p^+$ structure in which the impurity concentration varies in the active layer is formed (FIG. 7A). This structure allows the diffusion length of minority carriers to be increased by an internal electric field generated in the $p^-$ region; thus, short-circuit current can be increased.

Figure 7B:
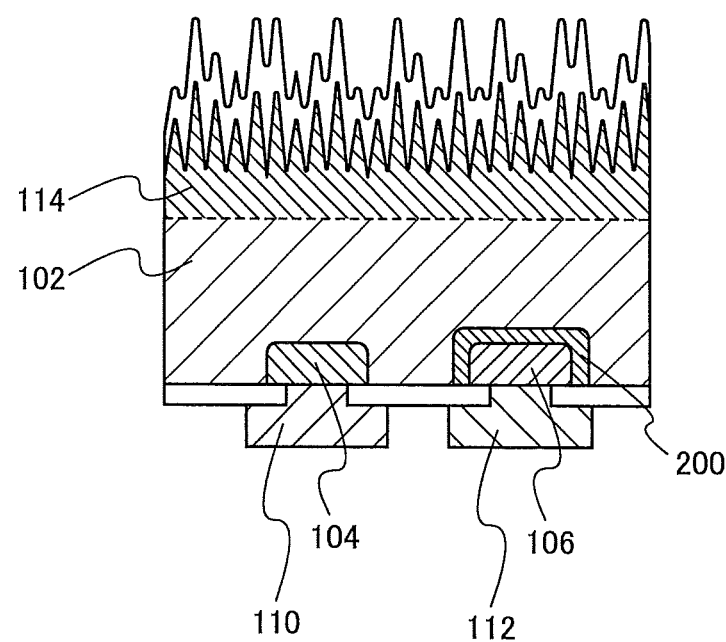

Alternatively, a $p^-$ region 200 may be provided between the p-type semiconductor substrate 102 (p region) and the $p^+$ region 106 so that an $n^+/p/p^-/p^+$ structure in which the impurity concentration varies in the active layer (FIG. 7B) is formed. This structure allows a high-resistant $p^-$ region to be provided between the p region and the $p^+$ region and an energy difference between the active layer and the $p^+$ region to be increased; thus, open voltage can be increased. Further, an $n^-$ region may be provided between the $n^+$ region and the p-type semiconductor substrate.

Note that the short-circuit current is current at the time when the voltage applied to the outside is 0 V and the open voltage is voltage at the time when the current flowing to the outside is 0 A. Each of the short-circuit current and the open voltage is one of the characteristics for determining the performance of a solar cell. The performance of a solar cell can be improved by increasing the short-circuit current and the open voltage.

Further, the $n^+$ region 104 is an n-type impurity region (also referred to as an n-type region) in which impurity elements imparting n-type conductivity are contained at high concentration; the $p^+$ region 106 is a p-type impurity region (also referred to as a p-type region) in which impurity elements imparting p-type conductivity are contained at high concentration. Further, an $n^-$ region is an n-type impurity region in which impurity elements imparting n-type conductivity are contained at low concentration; a $p^-$ region is a p-type impurity region in which impurity elements imparting p-type conductivity are contained at low concentration. Note that the term "high concentration" means the case where the carrier density of each region is higher than the carrier density of the semiconductor substrate 102, whereas the term "low concentration" means the case where the carrier density of each region is lower than the carrier density of the semiconductor substrate 102.

This embodiment can be combined with any of the other embodiments as appropriate.

(Embodiment 2)

In this embodiment, an example of a manufacturing method of a photoelectric conversion device will be described.

Figure 2A:
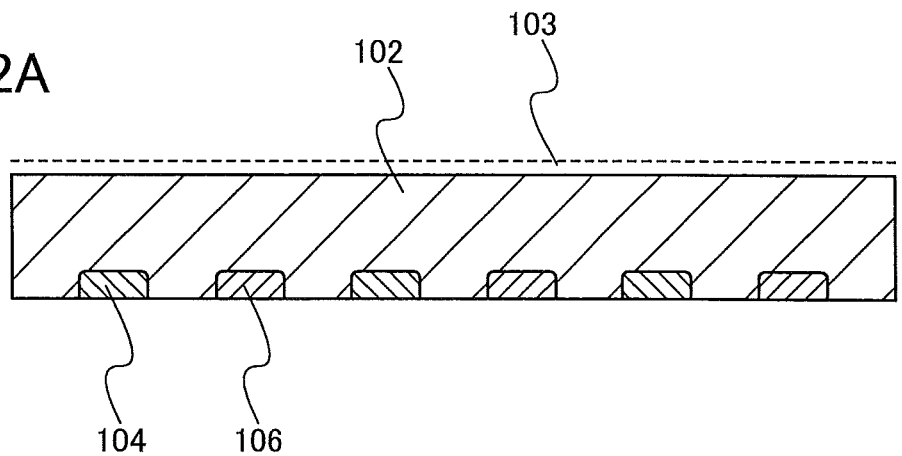
FIGS. 2A to 2C illustrate a manufacturing method of a photoelectric conversion device.

A metal layer 103 is formed on the front surface (a light-receiving surface) of the semiconductor substrate 102 (FIG. 2A).

Here, a p-type single crystal silicon substrate is used as the semiconductor substrate 102. Note that an n-type substrate may be used.

It is preferable that the metal layer 103 be formed to have an extremely small thickness of approximately several nanometers. The extremely small thickness of the metal layer 103 makes it possible to suppress absorption or reflection of incident light from the front surface of the semiconductor substrate 102 by the metal layer 103. Here, the thickness of the metal layer 103 is greater than or equal to 1 nm and less than or equal to 10 nm.

Further, it is preferable that metal materials contained in the metal layer 103 be dispersed homogeneously in the front surface of the semiconductor substrate 102 and be held.

The metal layer 103 is formed by a sputtering method or the like with the use of a metal material typified by platinum, aluminum, copper, titanium, or an aluminum alloy to which silicon, titanium, neodymium, scandium, molybdenum, or the like is added. Note that a metal material which forms suicide by reacting with silicon is preferably used. When the metal layer 103 becomes silicide, light reflection can be reduced.

Alternatively, the metal layer 103 may be formed by a method by which a solution containing any of the metal materials is applied onto the front surface of the semiconductor substrate 102. By this method, the concentration of the metal material in the solution can be controlled, which enables the metal layer 103 to be thin. In addition, the metal materials contained in the metal layer 103 can be dispersed homogeneously.

Next, the $n^+$ region 104 and the $p^+$ region 106 are formed on the back surface side of the semiconductor substrate 102 (FIG. 2A).

The $n^+$ region 104 can be formed by adding an impurity element imparting n-type conductivity (e.g., phosphorus or arsenic) by doping or the like with the use of a mask.

The $p^+$ region 106 can be formed by adding an impurity element imparting p-type conductivity (e.g., aluminum or boron) by doping or the like with the use of a mask.

Figure 2B:
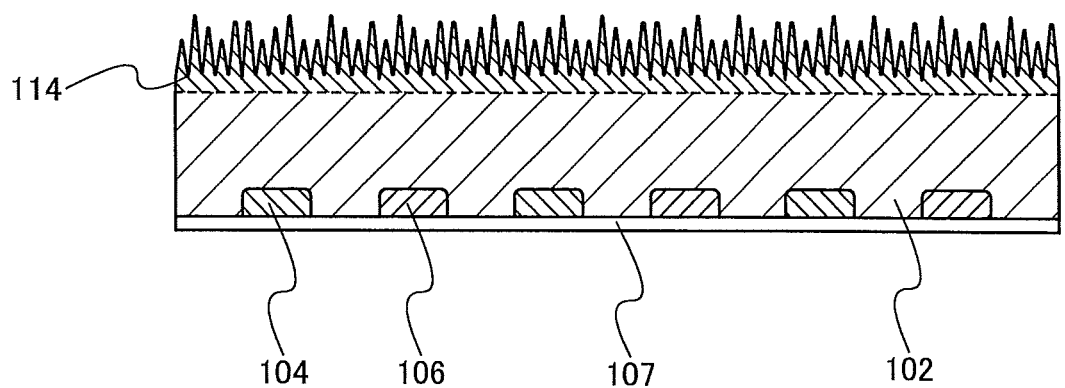

Next, an insulating film 107 is formed on the back surface of the semiconductor substrate 102 in which the $n^+$ region 104 and the $p^+$ region 106 are formed (FIG. 2B).

The insulating film 107 is a silicon oxide film or the like and functions as a protective film for the semiconductor substrate 102. The insulating film 107 can protect the semiconductor substrate 102 when a group of whiskers is formed later.

Next, a group of whiskers 114 formed of a crystalline semiconductor is formed over the metal layer 103 (FIG. 2B). An example in which crystalline silicon is grown to have whiskers will be described below.

The group of whiskers 114 is formed by a low pressure chemical vapor deposition method (also referred to as an LPCVD method).

The LPCVD method is performed using a source gas containing silicon (the semiconductor material) while heating is performed. The heating temperature is set higher than 550° C. and lower than or equal to the temperature that an LPCVD apparatus and the semiconductor substrate 102 can withstand, preferably higher than or equal to 580° C. and lower than 650° C. In addition, the pressure in a reaction chamber of the LPCVD apparatus is set higher than the lower limit of the pressure that can be held with the source gas supplied and lower than or equal to 200 Pa. Examples of the source gas containing silicon include silicon hydride, silicon fluoride, and silicon chloride; typically, $SiH_4$, $Si_2H_6$, $SiF_4$, $SiCl_4$, $Si_2Cl_6$, and the like are given. Note that hydrogen may be introduced into the source gas.

Since the group of whiskers 114 can be formed by a vapor deposition method, the semiconductor substrate 102 is not contaminated. For that reason, it can be said that the vapor deposition method is superior to a method of forming an uneven structure by etching the semiconductor substrate 102.

In such a manner, the structure of the group of whiskers 114, which is described in Embodiment 1, can be formed.

Figure 5:
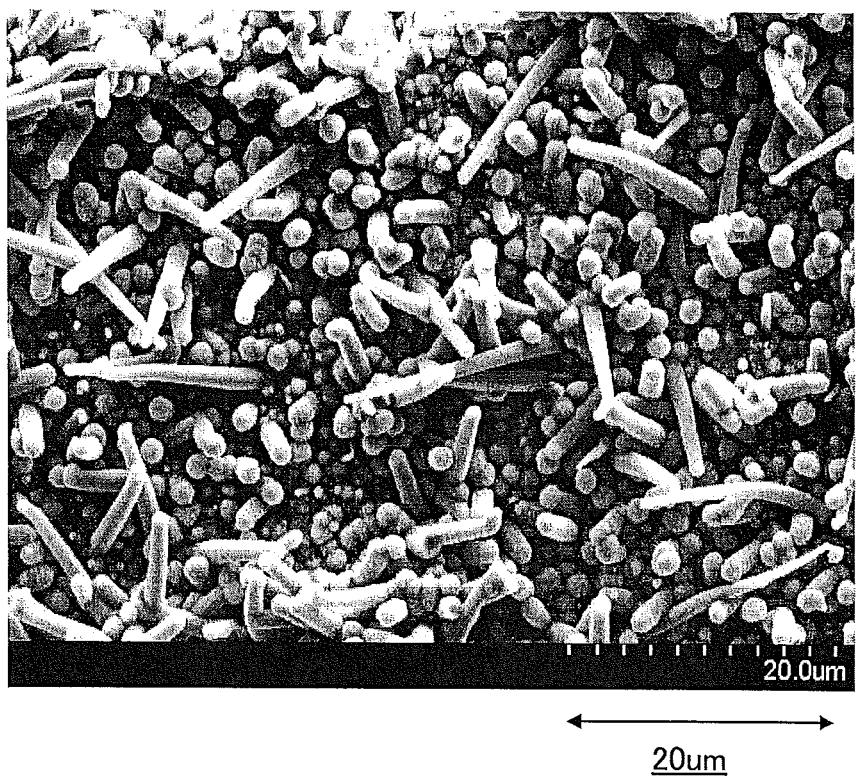
FIG. 5 shows structures of whiskers.

FIG. 5 is a planar scanning electron microscope (SEM) image of the group of whiskers 114. As shown in FIG. 5, crystalline silicon obtained in the above process includes a large number of column-like protrusions or needle-like protrusions. A long protrusion has a length of approximately 15 μm to 20 μm along its axis. In addition to the long protrusions, a plurality of short protrusions exists. Some protrusions have axes that are substantially perpendicular to the metal layer 103, and other protrusions have axes that are oblique to the metal layer 103. Note that a titanium film is used as the metal layer 103 in FIG. 5.

Next, the insulating film 107 formed on the back surface of the semiconductor substrate 102 is removed with hydrofluoric acid or the like.

Figure 2C:
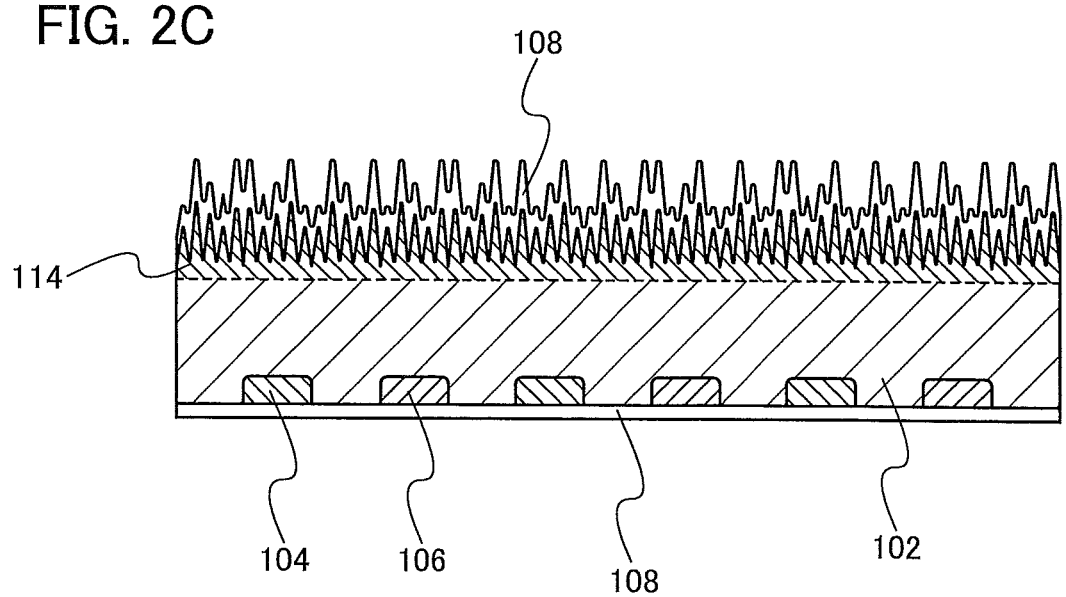

Next, insulating films 108 are formed on the surface of the group of whiskers 114 and the back surface of the semiconductor substrate 102 (FIG. 2C). The insulating film 108 is a silicon nitride film or the like and functions as a passivation film.

Figure 3A:
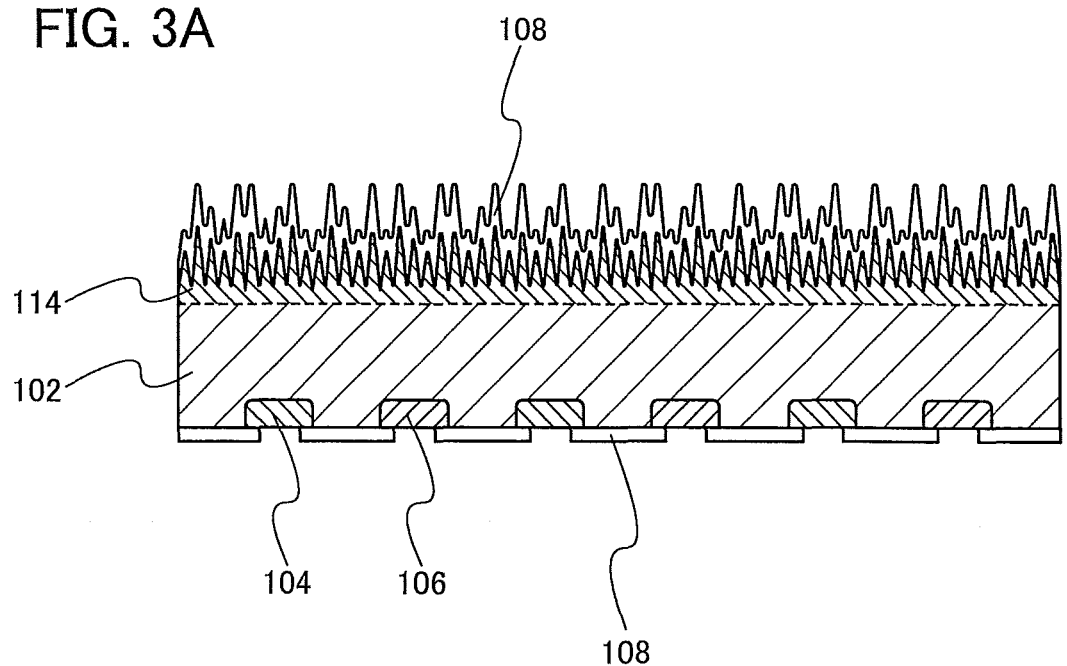
FIGS. 3A and 3B illustrate the manufacturing method of the photoelectric conversion device.

After that, contact holes are formed in the insulating film 108 formed on the back surface of the semiconductor substrate 102, whereby the $n^+$ region 104 and the $p^+$ region 106 are exposed (FIG. 3A).

The contact holes can be formed by irradiating the insulating film 108 with laser light, by etching with the use of a mask, or the like.

Figure 3B:
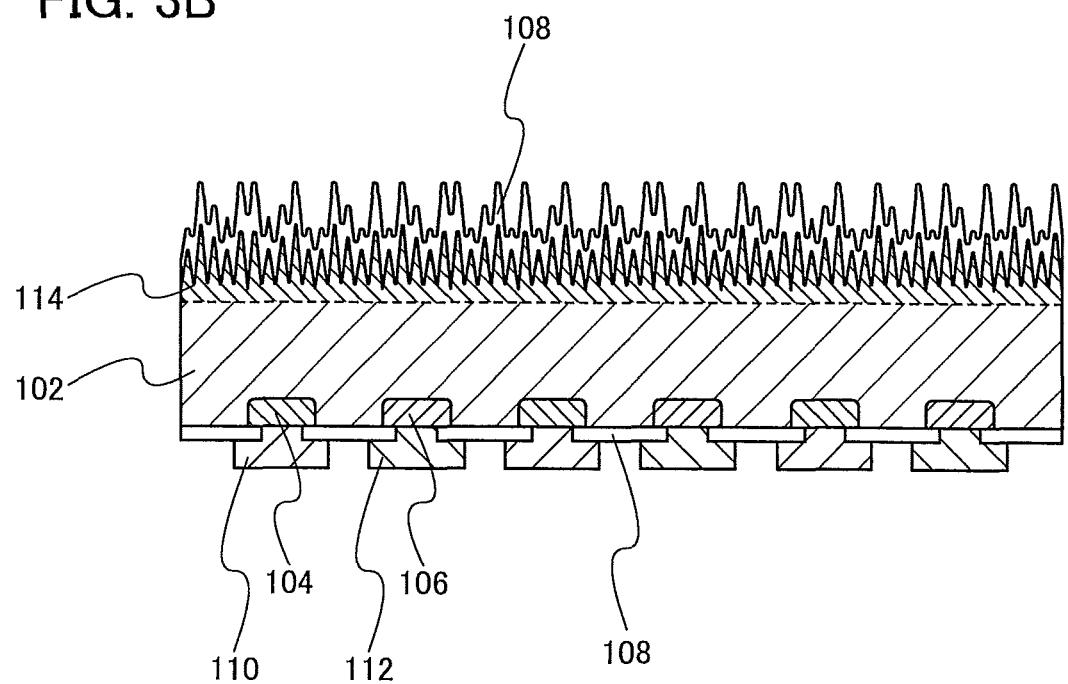

Then, an electrode 110 and an electrode 112 that are electrically connected to the $n^+$ region 104 and the $p^+$ region 106, respectively, are formed by a screen printing method, an evaporation method, or the like (FIG. 3B).

Note that the electrode 110 and the electrode 112 can be formed using an element selected from aluminum, silver, titanium, tantalum, tungsten, molybdenum, and copper, or an alloy material or a compound material which mainly contains any of the elements. Alternatively, a stack of these materials may be used.

Through the above process, the photoelectric conversion device can be manufactured.

Note that the metal layer 103 may be removed by gettering. As the gettering, for example, heat treatment is performed at temperatures higher than or equal to 800° C. and lower than or equal to 1150° C. in an oxidizing atmosphere containing a halogen element. Specifically, heat treatment may be performed at 950° C. in an atmosphere containing oxygen and hydrogen chloride at 3%. The metal layer 103 is removed by gettering, which allows the amount of incident light to be increased. Alternatively, the metal layer 103 may be etched with hydrofluoric acid or the like.

This embodiment can be combined with any of the other embodiments as appropriate.

(Embodiment 3)

In this embodiment, an example of a manufacturing method of a photoelectric conversion device, which is different from the manufacturing method described in Embodiment 2, will be described.

In Embodiment 2, the metal layer 103 is formed in a film form on the front surface of the semiconductor substrate 102.

In contrast, in this embodiment, an island-shaped metal layer is formed on the front surface of the semiconductor substrate 102, instead of the metal layer 103 illustrated in FIG. 2A. The island-shaped metal layer may be formed by a screen printing method, an evaporation method, or the like.

Figure 4:
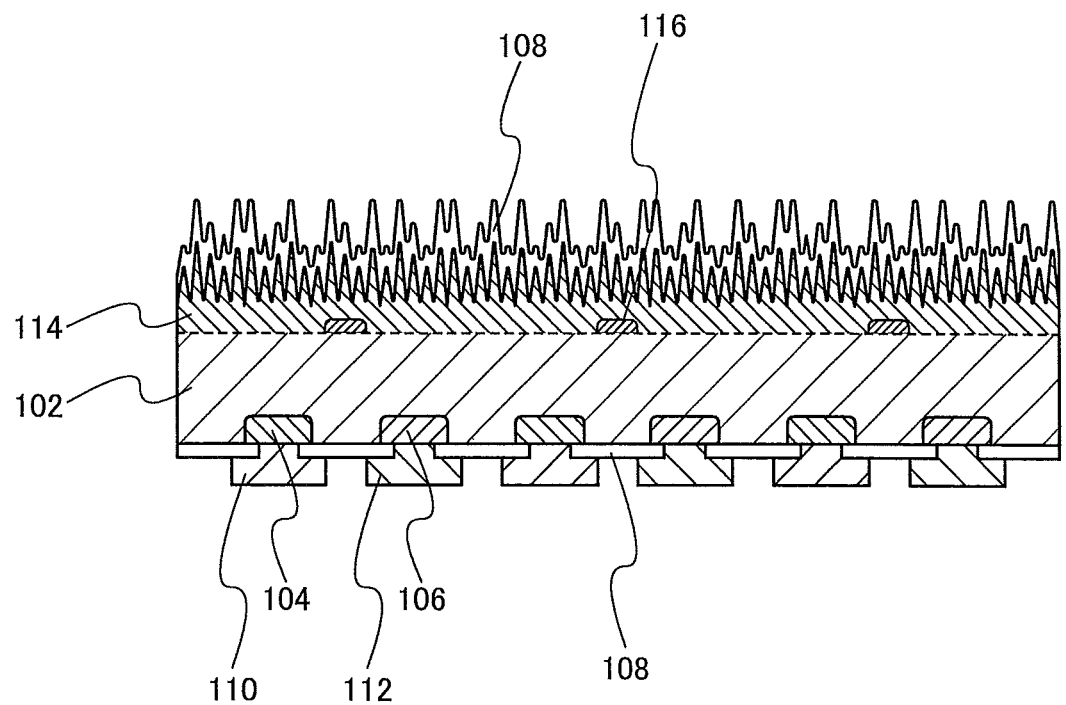
FIG. 4 illustrates a structure of the photoelectric conversion device.

Accordingly, in a photoelectric conversion device after manufacture, an island-shaped metal layer 116 is provided between the front surface of the semiconductor substrate 102 and the group of whiskers 114 (FIG. 4). When the island-shaped metal layer 116 is formed, reflection or the like can be reduced as compared to the case where a metal layer is formed over the entire surface of the semiconductor substrate.

Other steps and the like are similar to those described in Embodiment 2.

This embodiment can be combined with any of the other embodiments as appropriate.

This application is based on Japanese Patent Application serial no. 2010-139799 filed with the Japan Patent Office on Jun. 18, 2010, the entire contents of which are hereby incorporated by reference.

What is claimed is:

1. A method for manufacturing a photoelectric conversion device, comprising the steps of:
    forming a metal layer over a front surface of a semiconductor substrate;
    supplying a semiconductor gas to the metal layer at a temperature of higher than 550° C. to form a plurality of whiskers over the front surface of the semiconductor substrate;
    irradiating a back surface of the semiconductor substrate with an n-type impurity gas to form an n-type impurity region on the back surface of the semiconductor substrate;
    irradiating the back surface of the semiconductor substrate with a p-type impurity gas to form a p-type impurity region on the back surface of the semiconductor substrate;
    forming a first electrode on the n-type impurity region; and
    forming a second electrode on the p-type impurity region.

2. The method for manufacturing the photoelectric conversion device according to claim 1, further comprising the steps of:
    forming an insulating film over the plurality of whiskers.

3. The method for manufacturing the photoelectric conversion device according to claim 1,
    wherein the n-type impurity region contains an n-type impurity element added by a doping method, and
    wherein the p-type impurity region contains a p-type impurity element added by a doping method.

4. The method for manufacturing the photoelectric conversion device according to claim 1,
    wherein the metal layer comprises an island structure.

5. The method for manufacturing the photoelectric conversion device according to claim 1,
    wherein the p-type impurity region comprises a first p-type impurity region and a second p-type impurity region, and
    wherein a first impurity concentration of the first p-type impurity region is different from a second impurity concentration of the second p-type impurity region.

6. The method for manufacturing the photoelectric conversion device according to claim 1,
    wherein each of the plurality of the whiskers comprises a protrusion with a diameter of greater than or equal to 500 nm and less than or equal to 3 μm, and a length of greater than or equal to 1 μm and less than or equal to 100 μm.

7. The method for manufacturing the photoelectric conversion device according to claim 1,
    wherein a reflectance of the plurality of the whiskers is less than or equal to 0.2%.

8. The method for manufacturing the photoelectric conversion device according to claim 1,
    wherein the metal layer is made of platinum, aluminum, copper, titanium, or an aluminum alloy including silicon, titanium, neodymium, scandium, or molybdenum.

9. A method for manufacturing a photoelectric conversion device, comprising the steps of:
    forming a metal layer over a front surface of a semiconductor substrate;
    supplying a semiconductor gas to the metal layer at a temperature of higher than 550° C. after forming the metal layer to form a plurality of whiskers over the front surface of the semiconductor substrate;
    irradiating a back surface of the semiconductor substrate with an n-type impurity gas to form an n-type impurity region on the back surface of the semiconductor substrate;
    irradiating the back surface of the semiconductor substrate with a p-type impurity gas to form a p-type impurity region on the back surface of the semiconductor substrate;
    forming an insulating layer on the n-type impurity region and the p-type impurity region;
    forming a first electrode on the n-type impurity region electrically connected to the n-type impurity region through a contact hole in the insulating layer; and
    forming a second electrode on the p-type impurity region electrically connected to the p-type impurity region through a contact hole in the insulating layer.

10. The method for manufacturing the photoelectric conversion device according to claim 9,
    further comprising: forming an insulating film over the plurality of whiskers.

11. The method for manufacturing the photoelectric conversion device according to claim 9,
    wherein the n-type impurity region contains an n-type impurity element added by a doping method, and
    wherein the p-type impurity region contains a p-type impurity element added by a doping method.

12. The method for manufacturing the photoelectric conversion device according to claim 9,
    wherein the metal layer comprises an island structure.

13. The method for manufacturing the photoelectric conversion device according to claim 9,
    wherein the p-type impurity region comprises a first p-type impurity region and a second p-type impurity region, and
    wherein a first impurity concentration of the first p-type impurity region is different from a second impurity concentration of the second p-type impurity region.

14. The method for manufacturing the photoelectric conversion device according to claim 9,
    wherein each of the plurality of the whiskers comprises a protrusion with a diameter of greater than or equal to 500 nm and less than or equal to 3 μm, and a length of greater than or equal to 1 μm and less than or equal to 100 μm.

15. The method for manufacturing the photoelectric conversion device according to claim 9,
    wherein a reflectance of the plurality of the whiskers is less than or equal to 0.2%.

16. The method for manufacturing the photoelectric conversion device according to claim 9,
    wherein the metal layer is made of platinum, aluminum, copper, titanium, or an aluminum alloy including silicon, titanium, neodymium, scandium, or molybdenum.

\* \* \* \* \*